(12) United States Patent
Aunet

(10) Patent No.: US 7,970,810 B2
(45) Date of Patent: Jun. 28, 2011

(54) NANOELECTRONICS

(76) Inventor: Snorre Aunet, Stjordal (NO)

( * ) Notice: Subject to any disclaimer, the term of this patent is extended or adjusted under 35 U.S.C. 154(b) by 1063 days.

(21) Appl. No.: 11/741,844

(22) Filed: Apr. 30, 2007

(65) Prior Publication Data

US 2008/0133635 A1 Jun. 5, 2008

Related U.S. Application Data

(60) Provisional application No. 60/796,712, filed on May 1, 2006.

(51) Int. Cl.
*G06F 7/38* (2006.01)
(52) U.S. Cl. .......................... 708/490; 708/705
(58) Field of Classification Search .................. None
See application file for complete search history.

(56) References Cited

U.S. PATENT DOCUMENTS

| | | | |
|---|---|---|---|
| 6,735,110 B1 * | 5/2004 | Lesea | 365/154 |
| 2004/0165418 A1 * | 8/2004 | Lesea | 365/154 |
| 2006/0221666 A1 * | 10/2006 | Kang et al. | 365/149 |
| 2007/0242498 A1 * | 10/2007 | Chandrakasan et al. | 365/154 |
| 2009/0045865 A1 * | 2/2009 | Li | 327/349 |

OTHER PUBLICATIONS

Gelsinger, "Microprocessors for the New Millennium: Challenges, Opportunities, and New Frontiers", Proc IEEE International Solid State Circuits Conference, 2001, pp. 22-25.
Schmid, et al. (2003) "Robust Circuit and System Design Methodologies for nanometer-Scale Devices and Single-Electron Transistors", Proc. IEEE Conference on Nanotechnology, 2, pp. 516-519.
Weste, et al., Chap. 10.2, Addition/Substraction, "CMOS VLSI Design—a Circuits and Systems Perspective", 3rd. Ed., ISBN 0-321-26977-2.
Meindl, (2003) "Beyond Moore's Law: The Interconnect Era", Computing in Science & Engineering, pp. 20-24.

* cited by examiner

*Primary Examiner* — David H Malzahn
(74) *Attorney, Agent, or Firm* — Hayes Soloway P.C.

(57) ABSTRACT

A circuit element includes a plurality of computation blocks connected at least partially in series for processing multi-bit numbers. Each of the computation blocks includes a plurality of transistors having characteristic threshold voltages. The circuit element is configured so that the transistors will each operate at a voltage below its threshold voltage. The circuit element includes a plurality of circuit sub-elements each having an output. The circuit sub-element outputs are connected together.

21 Claims, 6 Drawing Sheets

NANOELECTRONICS

CROSS-REFERENCE TO RELATED APPLICATION

This application claims priority to U.S. Provisional Application entitled, "Improvements in Nanoelectronics" having Ser. No. 60/796,712, filed May 1, 2006, which is entirely incorporated herein by reference.

FIELD OF THE INVENTION

This invention relates to improvements in the design and construction of nanoelectronic circuits, in particular in respect of their power consumption and ease of manufacture. It relates particularly, although not exclusively, to complementary metal oxide semiconductor (CMOS) circuits and other technologies having similar characteristics.

BACKGROUND TO THE INVENTION

It is accepted that two of the most important challenges facing semiconductor designers are to reduce the power consumption of devices and to increase their manufacturability. There is an ever-growing number of applications where minimizing power consumption is of critical importance, e.g. space electronics, implants, wireless sensor networks, wearable electronics, mobile phones, laptops and PDAs to name but a few. However even in applications where an integral power source is not necessarily required, such as desktop personal computers, the impact of Moore's law (according to which microprocessors tend to double the number of transistors every 2 years) means that power densities are making it increasingly difficult to provide effective cooling. This is hampering efforts to increase miniaturization. The increasing densities are also making processors more prone to manufacturing defects.

Moore's law cannot continue if the power consumption associated with existing CMOS circuits is maintained, as was demonstrated by Gelsinger in *Microprocessors for the new Millennium: Challenges, Opportunities and New Frontiers, Proc IEEE International Solid State Circuits Conference,* 2001, pp. 22-25 where it is illustrated that predicted powers are excessive and prohibitively large for any practical application. For example, a simple extrapolation of current trends suggests power densities of the order of those found in nuclear reactors and rocket nozzles before the end of this decade. It is clear that total power consumption will become the limiting factor for future CMOS circuits.

The increasing density of components in microprocessors is not only problematic from the point of view of reduced spatial area for each transistor in which the heat generated by current flowing through it must be dissipated; but also from the point of view that as layers become thinner there is a greater average leakage tendency from the transistor gates as a result of quantum tunneling. This increases the standing current consumption of processors and therefore their average operating temperatures.

SUMMARY OF THE INVENTION

When viewed from a first aspect, the present invention provides a circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of circuit sub-elements each having an output, and wherein said circuit sub-element outputs are connected together.

When viewed from a second aspect the present invention provides an integrated circuit on a semiconductor material, said integrated circuit including a circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of circuit sub-elements each having an output, and wherein said circuit sub-element outputs are connected together.

When viewed from a third aspect the invention provides a data processor comprising: a power supply; and a circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of circuit sub-elements each having an output, and wherein said circuit sub-element outputs are connected together.

When viewed from a fourth aspect the invention provides a method of operating a circuit element comprising a plurality of computation blocks connected at least partially in series for processing multi-bit numbers, each of said computation blocks comprising a plurality of transistors having characteristic threshold voltages, wherein said circuit element comprises a plurality of circuit sub-elements each having an output, and wherein said circuit sub-element outputs are connected together, said method comprising: applying a voltage to said circuit element, said voltage being sufficiently low that each of the transistors is operated below its threshold voltage.

As will be explained further herein, the invention enables a very simple and robust solution for the challenges set out hereinabove.

BRIEF DESCRIPTION OF DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF PREFERRED EMBODIMENTS

Firstly transistors are utilised in their sub-threshold region, i.e. with their supply voltage lower than the absolute values of their inherent threshold voltages.

Operating transistors in the sub-threshold domain means that there is an approximately exponential relationship between the voltage across the gate and source nodes and the corresponding current passed between the source and drain nodes. The exponential relationship arises from the underlying diffusion of charge carriers across a barrier which is governed by a Boltzmann distribution. Thus the sub-threshold region in which the transistors are configured to operate in accordance with the invention is the one in which the source-drain current is dominated by exponential currents rising from modulated Boltzmann distributed energies. This region of the response curve of a transistor is also know as the weak or moderate inversion region. By contrast the traditional saturation region, where the vast majority of electronic circuits operate, is known as the strong inversion region. It should be appreciated that the dependence may not be a strictly exponential one in the sub-threshold region but as mentioned above the Boltzmann derived distribution will dominate, making at least the greatest contribution to the actual dependence. For example the exponential dependence could dominate by at least an order of magnitude.

Figure 1:
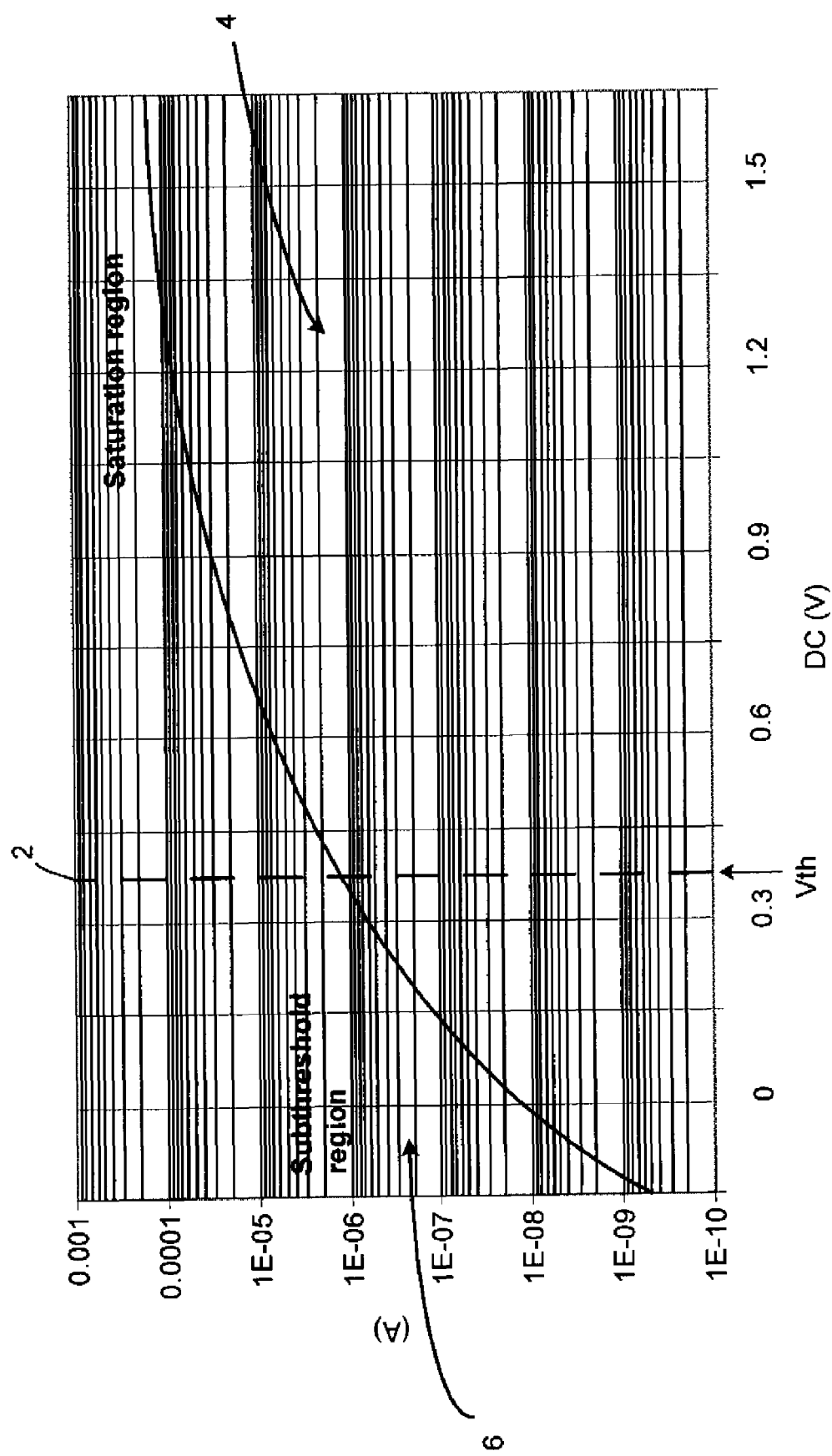
FIG. 1 is plot of gate-source voltage against drain-source current for a typical transistor.

It can be shown that in sub-threshold operation, reductions of several orders of magnitude in the corresponding power consumption can be achieved when compared to regular strong-inversion circuits operating at the same frequency. The reduction of power consumption is mainly due to the fact that current levels may be orders of magnitude lower in the sub-threshold region than in the classical saturation region, as illustrated in FIG. 1. The current levels between drain and source, $I_{ds}$ as seen on the vertical axis, are up to several orders of magnitude lower in the sub-threshold region of operation, when compared to saturation.

Reducing the power consumption reduces the electromagnetic fields, putting less stress on the components. Also, the reduced current levels experienced with sub-threshold operation reduces the risk of phenomena like electromigration, which is potentially damaging to chip functionality. Moreover, having the opportunity to reduce the current levels dramatically, compared to other known arrangements, means that the electromagnetic fields generated are weaker, meaning that there is less interference and signal coupling with surrounding circuitry or other systems on the chip.

Although transistors operating in the sub-threshold region have been employed previously in certain limited specific circumstances, the overwhelming majority of semiconductor designs have used transistors in the saturation or strong inversion mode since this gives reliable and robust results. In the sub-threshold mode on the other hand, less reliable results are achieved. This is due to the strongly exponential relationship between gate-source potential and source-drain current level which can display a significant variance between transistors and is sensitive to environmental conditions.

In accordance with the present invention; however, the above-mentioned disadvantages of sub-threshold operation are offset by connecting together, i.e. short-circuiting, the outputs of multiple circuit sub-elements. This gives two related advantages. Firstly, it gives a greater degree of predictability by effectively averaging the outputs so that wider tolerances associated with sub-threshold operation do not have such a compromising effect. Secondly, even with out-of-tolerance defects and faults (which may be transitory or inherent) in one of the circuit sub-elements, it gives a level of redundancy to the arrangement that allows correct operation on the basis of the remaining functioning circuit sub-elements.

The redundancy scheme described herein increases the ease of manufacture of integrated circuits that employ it, since mismatch between e.g. transistor threshold voltages is reduced as the effective threshold voltage becomes an average of the threshold voltages of, preferably identical, redundant transistors.

Furthermore, the proposed redundancy scheme allows damage of single transistors or wires while still maintaining functionality, even with a redundancy factor down to only two (2). This is of importance since relaxing the requirement for 100 percent fault-free devices and interconnects has the potential to reduce costs of manufacturing, verification, and test dramatically. This is becoming an increasingly important issue as a typical digital chip will fail if even a single transistor or wire is defective. Clearly the greater the number and density of transistors and interconnects, the higher the probability that a given chip will have such a failure and hence the higher the reject rate. In accordance with the invention however a significant improvement in the reject rate may be achieved.

Schemes for introducing redundancy into semiconductor logic circuits have been previously proposed, e.g. Schmid A., Leblebici Y. (2003) *Robust Circuit and System Design Methodologies for Nanometer Scale Devices and Single—Electron Transistor—Proc. IEEE Conference on Nanotechnology*, 2. pp. 516-519. However, such schemes are very complicated and applicable only in narrow technologies. The inventor has appreciated that when looking at the four-layer arrangement proposed in the Schmid and Leblebici paper above, this has come from a digital electronics design perspective. The apparent simplicity of connecting the outputs together in accordance with the present invention belies the fact that this is a completely different, analog rather than digital, perspective to take.

Instead of using four layers as proposed by Schmid and Leblebici, the solution in accordance the invention, saves layers. If a preferred embodiment were to be compared to the Schmid and Leblebici teaching, the third and fourth layers of the four layers of that teaching would be effectively replaced with simple wires, which are quite robust compared to circuits containing transistors. This simplicity means that the invention may be implemented so as to be less error prone and a less expensive implementation.

It is stated in the Schmid and Leblebici reference that their arrangement can withstand faults in the second layer, but it is not clear how robust it would be if defects appear in the other layers. Also, it uses a multi level signal for stage number 3, which in itself may be prone to error, especially if the supply voltage fall.

The architecture presented in the Schmid and Leblebici reference seems to be aimed at conventional (saturation level) logic, since the logic "1" levels seem to be around 3.0 V, which represents a relatively high supply voltage, not consistent with sub-threshold operation. It would therefore dissipate two or three orders of magnitude more power than preferred embodiments of the invention.

In accordance with the invention, a plurality of circuit sub-elements have their outputs connected together to give redundancy and the attendant advantages set out above. The level of circuit architecture at which this redundancy is provided is not essential. For example, it could be at the individual transistor level, at the individual gate level or at a higher level such as that of individual computation blocks (e.g. adders). Of course the redundancy could be provided at any intermediate level instead and/or at more than one level. Indeed the sub-elements connected together need not be logic components. This feature would apply equally to analog devices. For example, the circuit sub-elements could be threshold gates for a neural network.

It is preferred that the circuit sub-elements whose outputs are shorted together are of the same construction, e.g. nominally identical transistors or gates. However, this is not essential as arrangements may be envisaged in which the configuration of the circuit sub-elements is not the same whilst still giving the same theoretical operation. Of course, even sub-elements of the same constructions will be unlikely to be identical to each other in practice in the sense that they will have different operating characteristics as a result of manufacturing tolerances. Indeed, averaging these tolerances is part of the reason why the described redundancy is beneficial.

Thus, two or more preferably identical circuit sub-elements, processing the same input signals, have their outputs short-circuited. For logic depth, several such groups of circuit sub-elements may be connected in series. Intermediate buffers might be used to improve definition of logic signal levels, if necessary.

The redundancy factor is the number of output-connected circuit sub-elements at each point. In other words it is the ratio of the number of sub-elements, e.g. transistors/gates/adders etc, provided to the theoretical minimum number needed to give the required operation. A redundancy factor of 9 or more might be appropriate in some circumstances but in preferred embodiments of the invention the redundancy factor is low, preferably 8 or less, e.g. 5 or 3. A redundancy factor of just 2 might be appropriate in some circumstances.

Using low redundancy factors and shorted outputs may be combined with a wide range of underlying circuit topologies. If, for example, one out of three identical, redundant, circuit units has a broken wire or a defective transistor the result on the output may still be of adequate quality. This is because the output value is dominated by the computation(s) done by the circuits without defects, hiding the effects of defective transistors or wires.

The computation blocks of the invention could be any of a variety of standard or non-standard circuit building blocks. In preferred embodiments, the computation blocks are selected from the group comprising: full adders, half adders and subtractors. Blocks which perform addition/subtraction are useful since they form the basis of a great majority of digital circuits. However, it should be understood that the invention is not limited to digital circuits. It could be applied to other circuits too, e.g. neural networks.

In accordance with the invention a multi-bit, at least partially serial, arrangement of computation blocks is provided. This goes against the teaching and prejudice of the art which is to employ parallel processing wherever possible for maximum processing speed. In general serial processing arrangements tend to have a slower performance than parallel ones that perform the same task but the inventor has realized that in the present context there are advantages which outweigh this as will be explained below with reference to a preferred embodiment in which the computation blocks are adders.

Addition forms the basis for many processing operations, from counting to multiplication to filtering. Therefore, adder circuits that add two binary numbers are the nucleus of many digital operations. Many adder architectures serve different performance/area requirements. To give one example, a core function can be served by the Full Adder ("FA"). The functionality of the FA is to compute Sum and Carry for binary addition of three input bits as is well known in the art. For addition operations on multi-bit numbers, multiple FAs can be connected together in an number of ways.

One way of connecting the multiple FAs is in a serial adder. The purest form of serial adder is the Ripple Carry Adder (RCA). As mentioned previously, and as is intuitive, serial processing tends to be slower than parallel processing. For the RCA the 'worst-case' delay between applying the signals representing the numbers to be added and being able to read the answer is determined by the time the Carry signal needs to propagate from the least significant bit position and through all the more significant stages. It's critical path delay is given by:

$$t_{rca} = t_{pg} + (N-1)t_{AO} + t_{xor}$$

where $t_{pg}$ is the delay of a 1 bit propagate/generate gate, $t_{AO}$ is the delay of an AND-OR gate, and $t_{xor}$ is the delay of a final sum XOR gate. N is the number of bits in the digital word.

A 32-bit RCA is extremely simple, comprising 32 Full Adders connected with the Carry output of each Full Adder (except the last) being connected to one of the inputs of the next in the chain. The other two inputs of each Full Adder receive the respective bits of the numbers to be added.

With the aim of increasing performance by speeding up computation of carry signals, a wide range of parallel adders have been made, doing more of their computations at the same time, instead of the serial way as for the RCA. Kogge-Stone adders are widely used in high-performance 32-bit and 64-bit adders, although there are many others such as Brent-Kung adders, Sklansky adders, Han-Carlson adders, Knowles adders and "Ladner-Fischer". The Kogge-Stone adder is described in greater detail in "CMOS VLSI Design—a Circuits and Systems Perspective" by Neil H. E. Weste and David Harris, 3rd Ed. ISBN 0-321-26977-2

The critical path for a Kogge-Stone adder can be approximated as:

$$t_{KS} = t_{pg} + (\log_2 N)t_{AO} + t_{xor}$$

Using these equations, and assuming that (for simplicity) all the three logic stages in the equations have the same intrinsic propagation delays, the ratio of $t_{rca}/t_{KS}$ is 33 unit delays divided by 7 unit delays in the case of 32 bit addition, i.e. about 4.7. In other words, for 32 bit addition a parallel adder is 4.7 times faster than a serial one. For 64 bit addition the parallel adder would be around 8.1 times faster than the serial adder, based on a similar calculation. This illustrates why parallel adders are so attractive in order to deliver high performance in terms of computational speed.

However, the inventor has appreciated that the situation is more complicated than suggested by the above simple analysis. Firstly, the analysis above does not take into account interconnections between the adders. Parallel adders such as the Kogge-Stone employ significantly more interconnections than parallel ones and when these are taken into account the speed improvement compared to the parallel adder is reduced from about four and a half times to below two and a half times.

A two and a half times speed advantage is still very significant. However, in accordance with preferred embodiments of the invention, even this advantage of the parallel over the serial can be cancelled by a modest increase in the supply voltage. To give an example a 32-bit serial adder can be operated at the same speed as a parallel (Kogge-Stone) adder by operating it with a 10-20 percent higher supply voltage than the parallel adder. It is important to appreciate, however, that since, in accordance with the invention, the components of the adder are operating in the sub-threshold region, the requirement for power and energy and energy is still drastically less than for conventional parallel adders.

Another important advantage of arrangements in accordance with the invention is that parallel adders use a much greater number of transistors than do serial ones. To return to the example of a comparison between 32 bit RCA and Kogge-Stone adders, it can be demonstrated that the serial RCA adders employs only approximately 17 percent of the number of transistors used for the parallel adder.

The much simpler, more compact design of serial adders also means that the number and length of interconnections are very significantly reduced. Interconnect latency and power consumption are playing an increasingly important role as technology scales. For example in a 2003 article by J. D. Meindl "*Beyond Moore's Law: The Interconnect Era*" Computing in Science and Engineering pp. 20-24, it is stated that " . . . both interconnect latency and energy dissipation now tend to dominate key metrics of transistor performance. For example, for current state-of-the-art technology, the latency of a 1-mm-long interconnect benchmark is approximately six times larger than that of a corresponding transistor. Moreover, the energy dissipation associated with a benchmark interconnects binary transition is approximately five times larger than that of a corresponding transistor. This "tyranny of interconnects" escalates rapidly for future generations of silicon technology."

It should be observed that the local and scaled wires have a delay that remain about constant, but that an increasing fraction of circuits are limited by wire delay rather than gate delay. Smaller circuits generally mean less distance for signals to travel, and less static power consumption, both reducing power consumption when compared to their more complicated counterparts.

The use of far fewer transistors has several important consequences. Firstly, it reduces the surface area on the chip taken up. This is important as the price for production of semiconductor chips is approximately proportional to the chip area. Secondly, the static power consumption is reduced. Increasingly, the static power consumption is a significant part of the total power consumption of semiconductors. Thirdly, the smaller chip area means that global signals on the chip, e.g. clock signals, have less distance to travel, which can significantly reduce further the total power consumption. It also reduces the tendency for problems such as clock skew to be incurred. A simpler design containing fewer transistors, wires and contacts between different physical layers will also tend, statistically, to suffer from fewer defects.

In accordance with the invention the computation blocks are arranged at least partially in series. In the example given above of the Ripple Carry Adder, the computation blocks are fully in series since the bits are effectively processed one at a time in sequence because of the need for the Carry bit to ripple through all the adders. However, a fully serial arrangement is not essential to the invention; it may be only partially serial in the sense that some simultaneous processing of bits takes place. Preferably, the arrangement is more serial than it is parallel.

Although it is presently envisaged that a primary application of the invention will be to CMOS processing circuits operating in sub-threshold, this is not essential. The invention could also be exploited by other technologies sharing similar properties, namely exponential relationships between voltages on certain nodes and drive currents. Another semiconductor example might be SiGe (Silisium Germanium) However, even a semiconductor is not essential. It could be implemented by circuits printed onto a suitable substrate.

Although the invention has present application at the 90 nanometer mode, it is clear that the advantages it brings in terms of reducing power consumption and improving manufacturability will become even more important in the move to 65 nanometers and on to the planned 10 nanometer mode.

Where reference is made herein to transistors, this is intended to cover any suitable type including PMOS or any active device of P-type, similar to a P-type transistor like PMOS; or NMOS or any active device of N-type, similar to a N-type transistor like NMOS the term should also be read to include (or may be substituted by) any other active device with similar behavior, that is to say a region of operation with a current response dominated by an exponential Boltzmann-like distribution of charge carriers.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

FIG. 1 is a graph showing the relationship between the voltage applied across the gate and source (X axis—linear) and the corresponding drain-source current (Y axis—logarithmic) for a typical NMOS transistor fabricated on a silicon chip. The threshold voltage $V_{th}$ is indicated by a dark line 2 and for the particular transistor represented in FIG. 1 the threshold voltage is slightly below 400 millivolts (mV). The actual voltages used will of course depend on the type of active device which is being used.

Prior art CMOS circuits are almost exclusively operated in the conventional saturation region 4 to the right of the threshold line 2. However, in accordance with the present invention, the transistors are operated by the sub-threshold region 6 to the left of the line 2. In other words, a supply voltage well below 400 mV is used, e.g. 100-300 mV.

As may be seen from FIG. 1, in the sub-threshold region 6, there is an approximately exponential relationship between the voltage and current which characterizes this region. It can also be seen that the absolute level of the current through the transistor is several orders of magnitude (bearing in mind the logarithmic scale) lower than in the saturation region 4. It follows that much less heat is generated by each transistor in embodiments of the invention.

Figure 2:
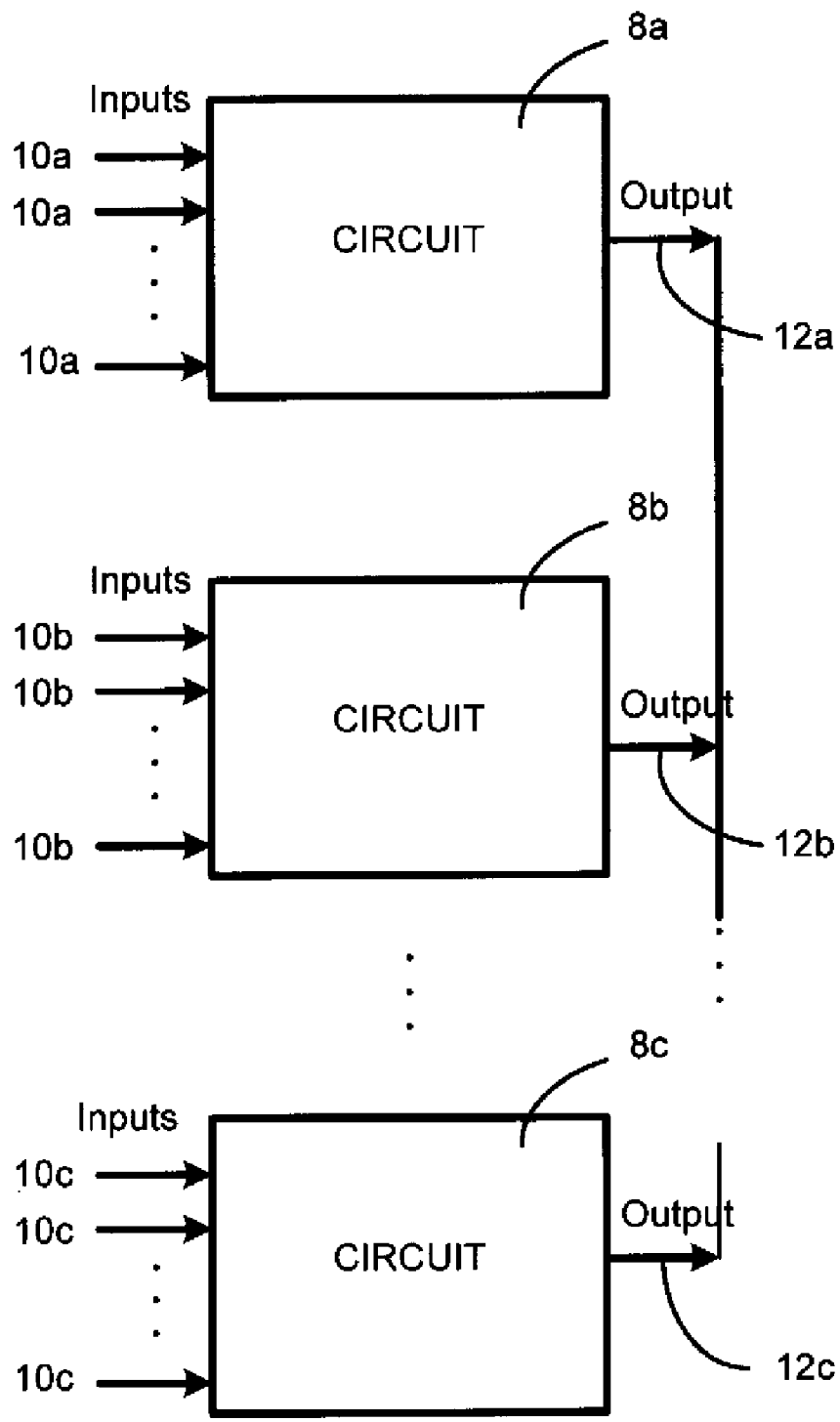
FIG. 2 is a schematic view showing redundant gates in accordance with the present invention.

FIG. 2 shows simplistically a redundancy scheme in accordance with the invention. Here three identical circuits 8a, 8b, 8c are shown, although as indicated by the ellipsis between the second and third circuits 8b, 8c, more than three circuits could be involved. The circuits 8a, 8b, 8c could be any appropriate circuit. A common example would be a Boolean logic gate, although this is by no means essential.

In this example each of the circuits 8a, 8b, 8c has three inputs 10a, 10b, 10c. Again the ellipsis indicates that more may be provided. In the simplest case the three inputs of each circuit receive the same input signals. However if the circuits 8a, 8b, 8c are symmetrical with regard to their inputs, the input signals may be applied to the inputs in different permutations to average any inherent unintended asymmetry either in operational characteristics or in failure tendency.

The outputs 12a, 12b, 12c are connected together by interconnects (i.e. short-circuited) forcing them to be at a common potential. In practice this means that the output signal will be an average of the outputs of each circuit 8a, 8b, 8c. If all circuits are functioning correctly this will have the beneficial effect of evening out differences in their outputs arising from ordinary manufacturing tolerances. This, accordingly, relaxes the stringency of the tolerance required for the individual devices and hence makes it easier and cheaper to fabricate chips including such circuits.

Furthermore, even if one of the circuits, for example 8a, were to be defective or develop a transient fault, this averaging effect would allow the other, correctly operating circuits 8b, 8c to dominate thus still giving an overall correct output.

Figure 3:
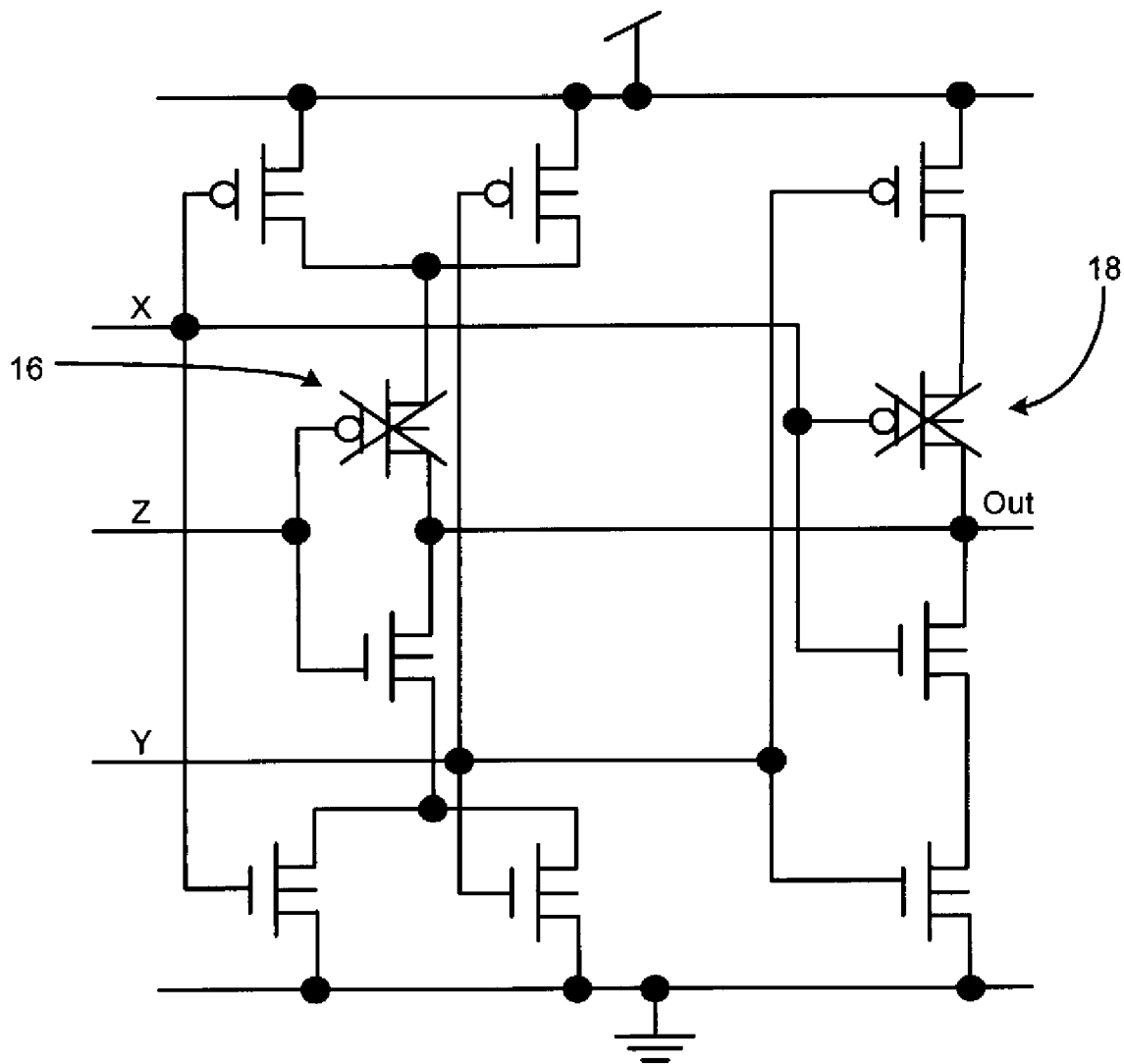
FIG. 3 is a circuit schematic employed for showing how the redundancy provides robust fault/defect tolerance in accordance with the present invention.

FIG. 3 shows a typical ten-transistor circuit structure which was used for a demonstrative simulation. A circuit having this structure was simulated in a 90 nm general purpose CMOS process available from ST Microelectronics, for redundancy factors 1 (no redundancy), 2 and 3. To simulate a reasonable practical 'worst case' situation, two of the PMOS transistors 16, 18 were removed.

Figure 4:
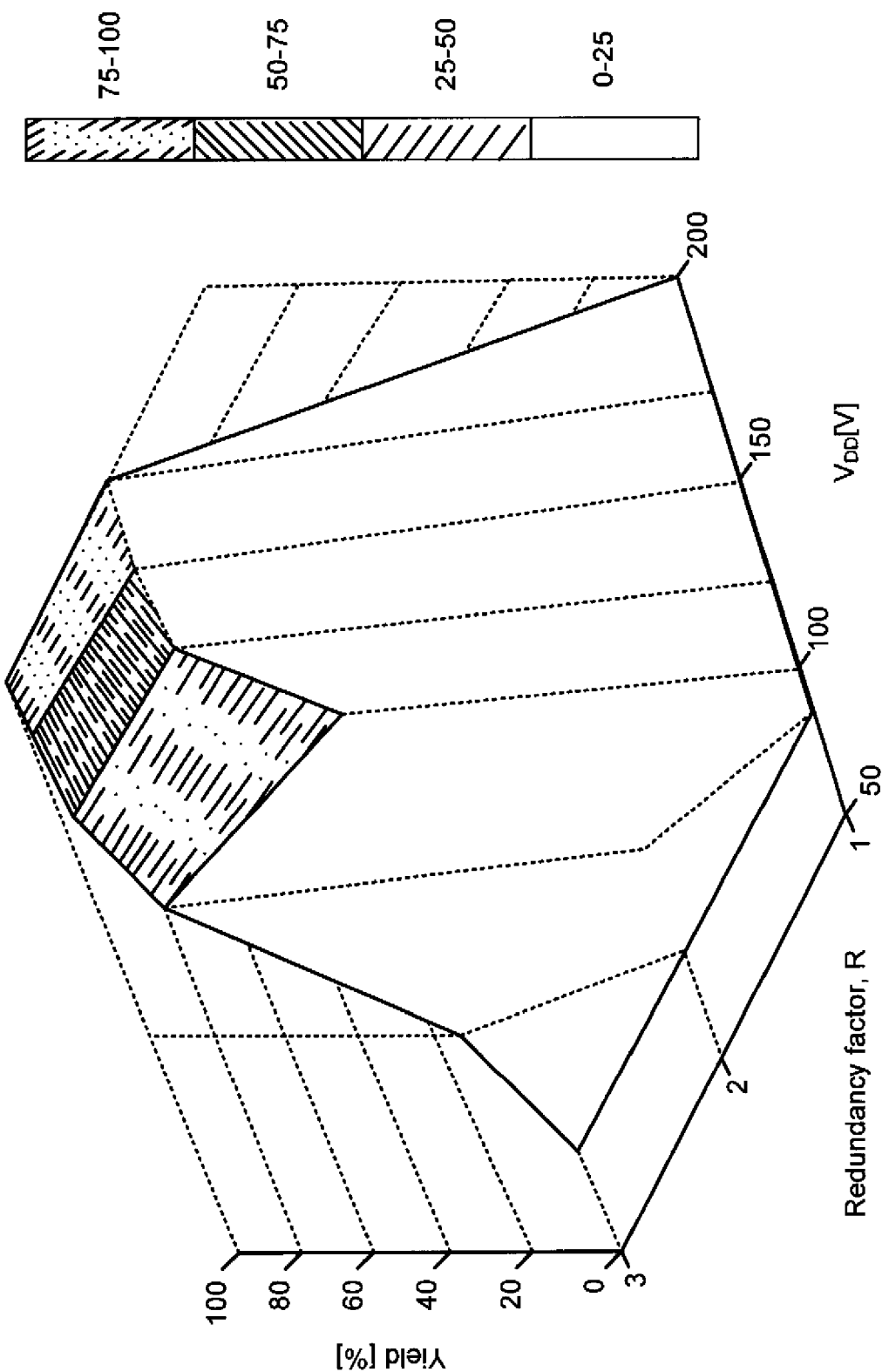
FIG. 4 is a 3-D plot showing the effect of redundancy factor and supply voltage on yield for a predetermined fault in accordance with the present invention.

Some of the results are depicted in FIG. 4. The vertical axis shows the "Yield", meaning the percentage of circuits that would provide proper output voltages under statistical variations (computer simulations), for different supply voltages and redundancy factors. Statistical simulations were done to take into account spread in physical parameters stemming from imperfections in the production process. Without redundancy (R=1) the circuit has no chance of withstanding defects in wires or transistors. However with a minimum redundancy of R=2 combined with a sufficiently high supply voltage a large percentage of circuits would function correctly. Indeed as may be seen according to these results, a redundancy R=2 and a supply voltage of minimum 175 mV would be enough to be 100 percent sure that the circuit would function properly in this case, even when two transistors were removed entirely. This is completely unlike traditional digital circuits, where a typical digital chip will fail if even a single transistor or wire is defective.

The simple redundancy principle is general, and can be applied to different underlying circuit structures, and with different redundancy factors. The redundancy factor chosen would be based on the number of faults expected on the chip from production, and calculated based on their statistical distribution.

Figure 5:
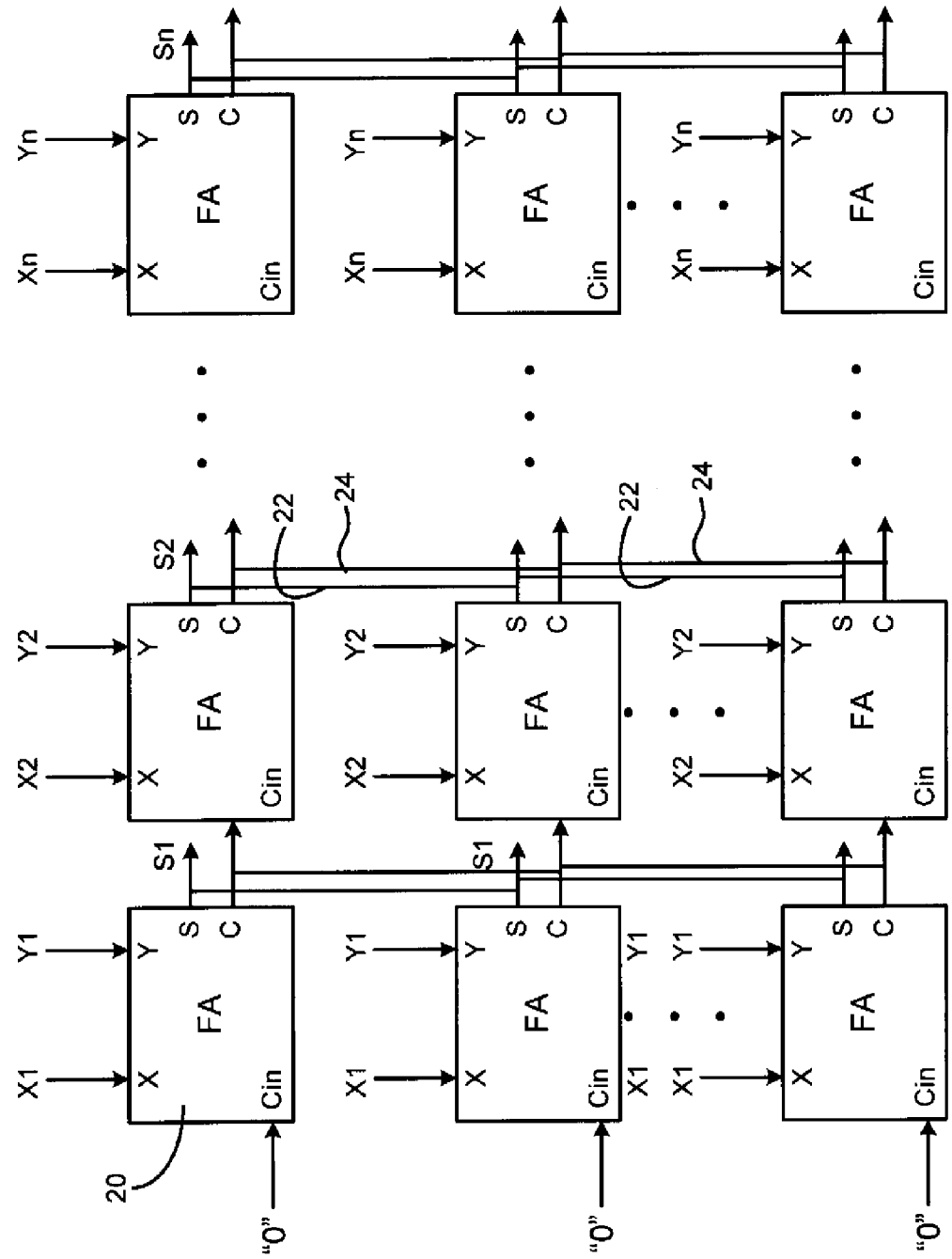
FIG. 5 is a schematic circuit diagram of an adder in accordance with the present invention.

FIG. 5 shows schematically a multiple-bit serial adder embodying the present invention. It comprises a matrix of Full Adders 20 to form rows of the well-known Ripple Carry Adders. The matrix has dimensions of N×R, where N is the number of bits and R is the redundancy factor. The Full Adders (FAs) 20 in each row of the matrix are connected so that two inputs Xi, Yi (i=1 to N) receive the ith bits from the binary numbers to be added. The third, Carry In, input (Cin) receives the Carry Out signal C from the preceding (i−1) Full Adder 20. In turn the Carry Out signal C is passed to the Cin of the next (i+1) Full Adder 20, The Cin of the first FA 20 in each row is tied to the logic 0 level.

The Sum outputs Si of each of the Full Adders 20 give the result of the binary addition of the two binary numbers X and Y. However the correct outputs are given only after a delay as the carry signal 'ripples' from one FA to the next, although as will be explained below, this is compensated for by making the devices run more quickly.

As well as the Full Adders 20 being connected in rows to form classical Ripple Carry Adders (RCAs), each also has its Carry and Sum outputs C, S shorted together with the C and S outputs of the corresponding FAs in the other rows. One set of interconnects 22 connect Sum outputs S and another set of interconnects 24 connect the Carry outputs C. This shorting together of the outputs provides redundancy in the sense that if one (or more depending on the redundancy factor R) of the FAs 20 in a given column is faulty (either temporarily or permanently), its output will be insufficient to overcome the majority of correct outputs in the composite (averaged) and so the correct output will dominate. The arrangement is therefore robustly fault and defect tolerant, wherever these may occur.

It will be seen that is this embodiment the redundancy referred to above is provided at the functional module (i.e. Full Adder) level. However, it could additionally or alternatively be provided at the individual gate level or even the individual transistor level.

Rather than running the transistors which make the logic gates which in turn make the Full Adders 20 at a supply voltage in the classical, saturation region, they are run at a lower supply voltage of the order of 100 to 300 mV. This means that the transistors are operating in their sub-threshold domain where an approximately exponential relationship between gate-source voltage and the ensuing current applies. However a higher supply voltage than is necessary for the required yield is used since this increases the performance (speed) sufficiently to match that of a parallel adder run at the lower voltage.

Figure 6:
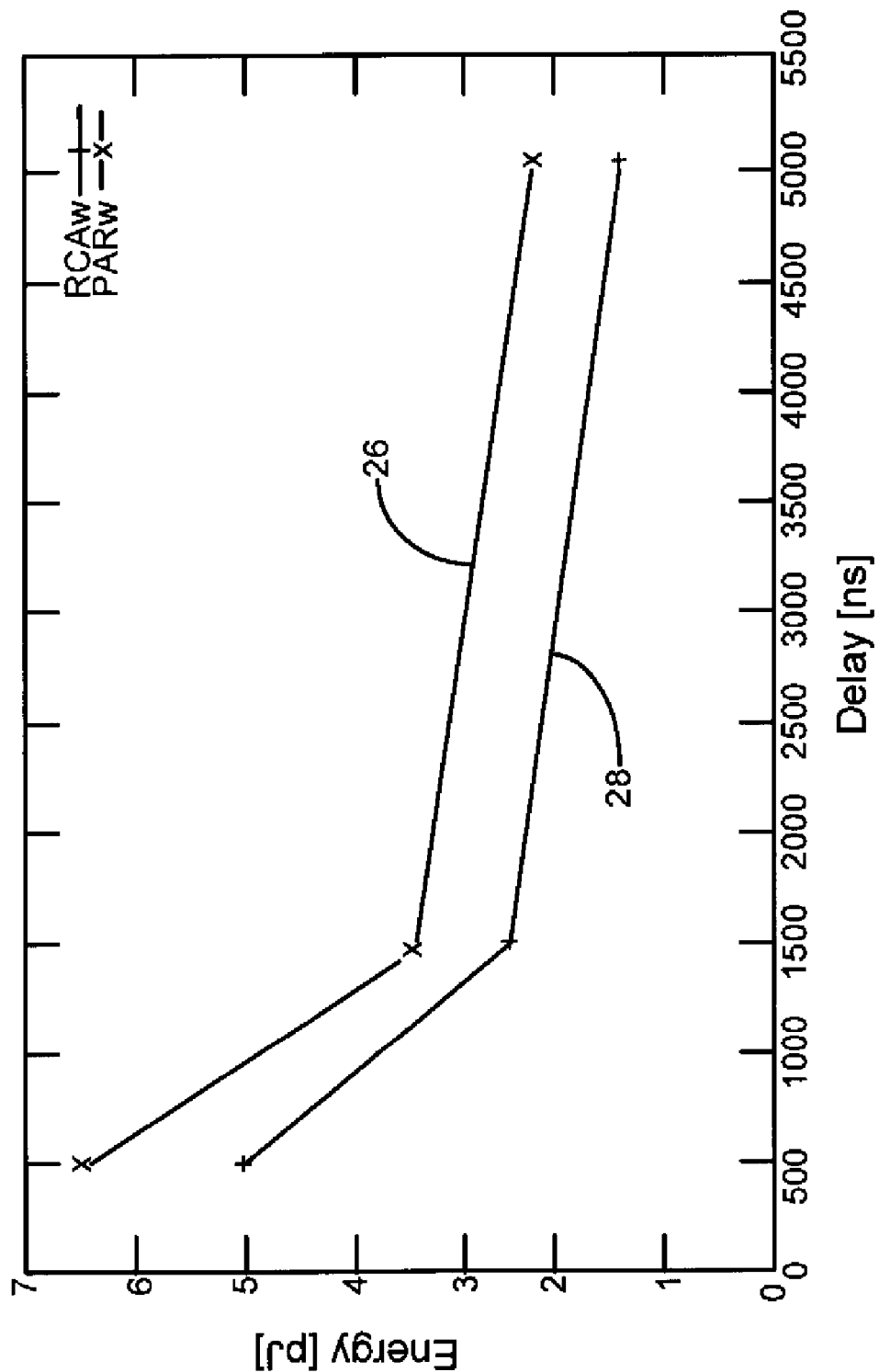
FIG. 6 is a plot of energy vs. delay for a serial adder and a parallel adder.

This is demonstrated in FIG. 6 which shows the results of simulations done on 100 nm Berkeley Predictive Technology Models. This is a plot of computation delay (i.e. the inverse of speed) on the horizontal axis against energy used, on the vertical axis. The upper line 26 connects data points representing a 32-bit parallel (Kogge Stone) adder run at 150, 200 and 250 mV respectively. The lower line 28 connects the data points for a 32-bit RCA run at 183, 238 and 292 mV respectively. As will be seen the serial adder performs as fast as the parallel for this small increase (10-20 percent) in the supply voltage, while still using less energy. This is a consequence of the exponential nature of sub-threshold operation. Indeed by referring back to FIG. 1 it will be seen that in the sub-threshold region 6, a tenfold increase in the drain current and hence approximately a tenfold increase in operational speed can be obtained by increasing the supply voltage by somewhere in the region of only 60 to 80 mV.

While the invention has been described by means of examples and embodiments thereof these are not exhaustive or limiting as the principles of the invention have a potentially beneficial application to a wide range of technologies.

What is claimed is:

1. A circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of redundant circuit sub-elements each comprising part or all of one of said computation blocks, each circuit sub-element having an output, and wherein said circuit sub-element outputs are connected together.

2. A circuit element as claimed in claim 1 wherein said circuit sub-elements comprise gates.

3. A circuit element as claimed in claim 1 wherein said circuit sub-elements each comprise a functional group of gates.

4. A circuit element as claimed in claim 1 wherein said circuit sub-elements comprise individual transistors.

5. A circuit element as claimed in claim 1 wherein said circuit sub-elements are of the same construction.

6. A circuit element as claimed in claim 1 wherein said plurality of circuit sub-elements defines a group, said circuit element further comprising a plurality of groups connected in series.

7. A circuit element as claimed in claim 6 further comprising intermediate buffers between consecutive groups.

8. A circuit element as claimed in claim 1 having a redundancy factor of 8 or less.

9. A circuit element as claimed in claim 1 having a redundancy factor of 3 or 2.

10. A circuit element as claimed in claim 1 wherein said computation blocks comprise adders.

11. A circuit element as claimed in claim 1 wherein said computation blocks are connected in an arrangement which is closer to a fully serial arrangement than it is to a fully parallel arrangement.

12. A circuit element as claimed in claim 1 configured as a Ripple Carry Adder.

13. A circuit element as claimed in claim 1 wherein said circuit element is a CMOS circuit element.

14. A circuit element as claimed in claim 1 wherein said transistors comprise at least one of NMOS transistors and PMOS transistors.

15. A circuit element as claimed in claim 1 wherein said transistors are configured to be operated on a voltage of 100 to 300 millivolts.

16. A circuit element as claimed in claim 1 provided on a semiconductor material.

17. An integrated circuit on a semiconductor material, said integrated circuit including a circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of redundant circuit sub-elements each comprising part or all of one of said computation blocks, each circuit sub-element having an output, and wherein said circuit sub-element outputs are connected together.

18. A data processor comprising:
a power supply; and
a circuit element comprising a plurality of computation blocks connected at least partially in series for processing multi-bit numbers, each of said computation blocks comprising a plurality of transistors having characteristic threshold voltages, said circuit element being configured so that the transistors will each operate at a voltage below its threshold voltage, wherein said circuit element comprises a plurality of redundant circuit sub-elements each comprising part or all of one of said computation blocks, each circuit sub-element each having an output, and wherein said circuit sub-element outputs are connected together.

19. A data processor as claimed in claim 18 wherein said transistors are operated on a voltage of 100 to 300 millivolts.

20. A method of operating a circuit element comprising a plurality of computation blocks connected at least partially in series for processing multi-bit numbers, each of said computation blocks comprising a plurality of transistors having characteristic threshold voltages, wherein said circuit element comprises a plurality of redundant circuit sub-elements each comprising part or all of one of said computation blocks, each circuit sub-element each having an output, and wherein said circuit sub-element outputs are connected together, said method comprising:
applying a voltage to said circuit element, said voltage being sufficiently low that each of the transistors is operated below its threshold voltage.

21. A method as claimed in claim 20 comprising applying a voltage in the range of 100 to 300 millivolts.

* * * * *